(12) United States Patent
Hong et al.

(10) Patent No.: US 8,126,668 B2
(45) Date of Patent: Feb. 28, 2012

(54) SIGNAL DETECTION USING DELTA SPECTRUM ENTROPY

(75) Inventors: Kwang-Seok Hong, Gyeonggi-do (KR); Yong-Wan Roh, Seoul (KR); Kue-Bum Lee, Seoul (KR)

(73) Assignee: Sungkyunkwan University Foundation for Corporate Collaboration, Gyeonggi-Do (KR)

( * ) Notice: Subject to any disclaimer, the term of this patent is extended or adjusted under 35 U.S.C. 154(b) by 645 days.

(21) Appl. No.: 12/040,734

(22) Filed: Feb. 29, 2008

(65) Prior Publication Data

US 2009/0177423 A1     Jul. 9, 2009

(30) Foreign Application Priority Data

Jan. 9, 2008 (KR) .................. 10-2008-0002768

(51) Int. Cl.
*G01R 23/00* (2006.01)
(52) U.S. Cl. .......... 702/75; 702/66; 702/181; 704/250
(58) Field of Classification Search .......... 702/66, 702/75, 76, 77, 179, 181; 704/250
See application file for complete search history.

(56) References Cited

U.S. PATENT DOCUMENTS

| | | | | |
|---|---|---|---|---|
| 5,749,068 | A  * | 5/1998  | Suzuki ......................... | 704/233 |
| 7,146,316 | B2 * | 12/2006 | Alves ........................... | 704/233 |
| 7,680,657 | B2 * | 3/2010  | Shi et al. ..................... | 704/233 |
| 2005/0091053 | A1 * | 4/2005 | Kobayashi et al. ........... | 704/250 |
| 2006/0100866 | A1 * | 5/2006 | Alewine et al. .............. | 704/226 |
| 2008/0001780 | A1 * | 1/2008 | Ohno et al. ................... | 340/904 |
| 2008/0072741 | A1 * | 3/2008 | Ellis .............................. | 84/609 |

OTHER PUBLICATIONS

Lin et al., "Speech Emotion Recognition Based on HMM and SVM", Proceedings of the Fourth International Conference on Machine Learning and Cybernetics, Guangzhou, Aug. 18-21, 2005.*
Renevey et al. "Entropy Based Voice Activity Detection in Very Noisy Conditions", In: EUROSPEECH 2001, pp. 1887-1890.*

* cited by examiner

*Primary Examiner* — Jeffrey R West
(74) *Attorney, Agent, or Firm* — James P. Muraff; Neal, Gerber & Eisenberg LLP

(57) ABSTRACT

Disclosed is a method of signal detection. A received input signal is divided into a frame unit and each input signal present in a first frame and a second frame is transformed into a frequency signal. Then, first power spectrum information and second power spectrum information are computed utilizing the transformed frequency signal and a delta spectrum entropy value corresponding to a difference of the two computed power spectrum information is obtained. A predetermined input signal is included in a predetermined frame among the input signal after judging through comparing the delta spectrum entropy value with a critical value. Desired signal can be detected in a noisy environment including a noise signal by using the delta spectrum entropy value.

23 Claims, 4 Drawing Sheets

FIG. 4

| Filter | CENTER FREQUENCY | START POINT | END POINT |
|---|---|---|---|
| fc[1] | 65.9219 | 0 | 125 |
| fc[2] | 138.052 | 93.75 | 187.5 |
| fc[3] | 216.975 | 125 | 281.25 |
| fc[4] | 303.33 | 187.5 | 375 |
| fc[5] | 397.818 | 281.25 | 500 |
| fc[6] | 501.204 | 375 | 593.75 |
| fc[7] | 614.327 | 500 | 718.75 |
| fc[8] | 738.102 | 593.75 | 843.75 |
| fc[9] | 873.535 | 718.75 | 1000 |
| fc[10] | 1021.72 | 843.75 | 1156.25 |
| fc[11] | 1183.86 | 1000 | 1343.75 |
| fc[12] | 1361.27 | 1156.25 | 1531.25 |
| fc[13] | 1555.39 | 1343.75 | 1750 |
| fc[14] | 1767.79 | 1531.25 | 2000 |
| fc[15] | 2000.2 | 1750 | 2250 |
| fc[16] | 2254.48 | 2000 | 2531.25 |
| fc[17] | 2532.72 | 2250 | 2812.5 |
| fc[18] | 2837.16 | 2531.25 | 3156.25 |
| fc[19] | 3170.27 | 2812.5 | 3531.25 |
| fc[20] | 3534.75 | 3156.25 | 3906.25 |
| fc[21] | 3933.55 | 3531.25 | 4343.75 |
| fc[22] | 4369.91 | 3906.25 | 4843.75 |
| fc[23] | 4847.37 | 4343.75 | 5343.75 |
| fc[24] | 5369.79 | 4843.75 | 5937.5 |
| fc[25] | 5941.41 | 5343.75 | 6562.5 |
| fc[26] | 6566.85 | 5937.5 | 7250 |
| fc[27] | 7251.21 | 6562.5 | 8000 |

410

SIGNAL DETECTION USING DELTA SPECTRUM ENTROPY

CROSS-REFERENCE TO RELATED PATENT APPLICATIONS

This application claims the benefit of Korean Patent Application No. 10-2007-0002768, filed on Jan. 9, 2008, in the Korean Intellectual Property Office, the disclosure of which is incorporated herein in its entirety by reference.

BACKGROUND OF THE INVENTION

1. Field of the Invention

The present invention relates to a method of signal detection using delta spectrum entropy, and more particularly, to a method of signal detection through obtaining delta spectrum entropy including time dependent information of frequency spectrum from input signals and then, detecting a target signal among the input signals utilizing thus obtained delta spectrum entropy. The present invention also relates to an apparatus for detecting input signals and a recording medium on which a program for executing the method is recorded.

2. Description of the Related Art

Recently, a method of transforming an input signal of time domain into a signal of frequency domain and then processing thus transformed signal is generalized. The signal processing at the time domain is more efficient when considering an operating amount and processing time. However, the performance of the signal having an SNR of low energy is rapidly deteriorated. Utilizing the frequency characteristic of the signal which is not exhibited at the time domain, the signal processing at the frequency domain exhibits further better performance at the low SNR.

In addition, an input signal processing method utilizing input signal entropy value transformed into a signal of frequency domain, is widely used in a various fields of information processing and signal processing.

For example, spectrum entropy information is widely utilized in various fields including network traffic anomaly detection, an apparatus and a method of finger print classification and finger print recognition, encoding and decoding of entropy, audio signal detection, target monitoring method of signal, and so on.

For example, conventionally, spectrum estimated information is computed at the frequency domain utilizing an input signal. And according to the computed spectrum information, the input signal is judged if it is the desired or undesired signal.

This kind of judging method is widely used in the field concerning the signal detection. Here, a normal signal is the desired signal, while the abnormal signal is undesired signal, e.g. noise.

In particular, most of the system using an audio signal treats the audio signal in the frequency domain.

According to the conventional method, suggested is a method of detecting a signal utilizing a statistic characteristic and auditory sense characteristic of human in processing an audio signal at the frequency domain of the audio signal.

As described above, the method implemented at the frequency domain utilizes information concerning the low frequency component or the high frequency component of the audio signal, or pitch information and hamonic information concerning integral frequency of fundamental frequency.

However, the above-described method is difficult in applying to an instrument of which miniaturization, mobility and real time processing should be guaranteed in an embedded environment of navigation system, PDA, cellular phone, etc. except a personal computer.

In addition, when an input signal is an audio signal, the detecting performance is guaranteed in a clean environment including no noise according to the conventional signal detecting method. However, in an environment including a white noise, the signal detecting performance is remarkably lowered according to the conventional method.

SUMMARY OF THE INVENTION

An object of the present invention considering the above-described problem is to provide a method of signal detection possibly detect signals utilizing a delta spectrum entropy value.

Another object of the present invention is to provide a method of signal detection possibly detecting an audio signal in an embedded environment.

Further another object of the present invention is to provide an efficient method of signal detection with respect to an audio signal through analyzing frequency in a noisy environment including white noise.

To accomplish the object, there is provided in the present invention a method of signal detection comprising (a) dividing a received input signal into a frame unit (b) transforming each input signal present in a first frame and a second frame into a frequency signal (c) computing first power spectrum information and second power spectrum information utilizing the transformed frequency signal (d) obtaining a delta spectrum entropy value corresponding to a difference of the computed power spectrum information and (e) judging if a predetermined input signal is included in a predetermined frame among the input signal through comparing the delta spectrum entropy value with a critical value.

Preferably, the step (a) is implemented by a step of (a-1) dividing the input signal into the frame unit through a window process.

The transforming in the step (b) is preferably implemented by using a fast fourier transform.

The step (d) includes (d-1) computing delta spectrum information which is difference between the first power spectrum information and the second power spectrum information (d-2) normalizing the computed delta spectrum information and (d-3) obtaining the delta spectrum entropy value from the normalized delta spectrum information.

Preferably, the delta spectrum information is computed by using the following equation, $S'(i,n) = S(i,n+1) - S(i,n)$ in which $S'(i,n)$ represents delta spectrum information corresponding to $i^{th}$ frequency component of $n^{th}$ frame, $S(i,n)$ represents power spectrum information corresponding to $i^{th}$ frequency component of $n^{th}$ frame, and $S(i,n+1)$ represents power spectrum information corresponding to $i^{th}$ frequency component of $n+1^{th}$ frame.

The computed delta spectrum information at the step (d-2) is normalized by the following equation, $$P[S'(i,n)] = \frac{|S'(i,n)|}{\sum_{M=1}^{M/2} |S'(m,n)|}$$

in which $P[S'(i,n)]$ represents normalized delta spectrum information corresponding to $i^{th}$ frequency component of $n^{th}$ frame, $S'(i,n)$ represents delta spectrum information corresponding to $i^{th}$ frequency component of $n^{th}$ frame, $S'(m,n)$ represents delta spectrum information corresponding to $m^{th}$ sample of $n^{th}$ frame, and M represents the number of samples included in one frame.

The delta spectrum entropy value is obtained by using the following equation, $$H'(n) = -\sum_{i=1}^{M/2} P[S'(i,n)]\log P[S'(i,n)]$$

in which H'(n) represents a delta spectrum entropy value of $n^{th}$ frame, P[S'(i,n)] represents normalized delta spectrum information corresponding to $i^{th}$ frequency component of $n^{th}$ frame, and M represents the number of samples included in one frame.

The step (e) includes (e-1) comparing the obtained delta spectrum entropy value and the critical value and (e-2) judging the input signal corresponding to the first frame as a detect signal when the obtained delta spectrum entropy value exceeds the critical value.

The first frame and the second frame are selected according to a time sequence among the divided frame and the steps from (b) to (e) are repeatedly implemented for every selected first frame and second frame.

The step (d) further comprises a step (d-4) comparing the delta spectrum entropy value with a predetermined standard value, and the step (e) is implanted only when the delta spectrum entropy value exceeds the standard value after the comparison at the step (d-4).

The step (d) includes (d-5) generating first mel-frequency filter bank (MFB) spectrum information and second mel-frequency filter bank information from the first power spectrum information and the second power spectrum information and (d-6) obtaining the delta spectrum entropy value from the generated first mel-frequency filter bank spectrum information and the second mel-frequency filter bank spectrum information, and wherein the input signal is an audio input signal.

The step (a) includes (a-3) filtering the input signal using a preemphasis filter emphasizing a high frequency domain and (a-4) dividing the filtered input signal into a certain frame unit through a hamming window process.

The mel-frequency filter bank spectrum information in the step (d-5) is generated through the following equation, $$M(b,n) = \frac{\sum_{i=L_b}^{U_b} V_b(i)S(i,n)}{\sum_{i=L_b}^{U_b} V_b(i)}$$

in which, M(b,n) represents delta mel-frequency filter bank spectrum information corresponding to $b^{th}$ mel-frequency filter of $n^{th}$ frame, $V_b(i)$ represents a weight applicable to $i^{th}$ frequency component of $b^{th}$ mel-frequency filter, S(i,n) represents power spectrum information corresponding to $i^{th}$ frequency component of $n^{th}$ frame, $L_b$ represents a start-frequency of $b^{th}$ mel-frequency filter, and $u_b$ represents an end-frequency of $b^{th}$ mel-frequency filter.

The step (d-6) includes (d-7) computing delta spectrum information utilizing the first mel-frequency filter bank spectrum information and the second mel-frequency filter bank information (d-8) normalizing the computed delta spectrum information and (d-9) obtaining the delta spectrum entropy value from the normalized delta spectrum information.

The delta spectrum information in the step (d-7) is computed from the following equation, $$M'(b,n) = M(b,n+1) - M(b,n)$$

in which, M'(b,n) represents delta spectrum information corresponding to $i^{th}$ frequency component of $b^{th}$ mel-frequency filter, M(b,n) represents mel-frequency filter bank spectrum information according to $b^{th}$ mel-frequency filter of $n^{th}$ frame, and M(b,n+1) represents mel-frequency filter bank spectrum information corresponding to $b^{th}$ mel-frequency filter of n+1$^{th}$ frame.

The computed delta spectrum information is normalized at the step (d-8) through the following equation, $$P[M'(b,n)] = \frac{|M'(b,n+1)|}{\sum_{m=1}^{B} |M'(m,n)|}$$

in which, P[M'(b,n)] represents normalized delta spectrum information according to $b^{th}$ mel-frequency filter of $n^{th}$ frame, M'(b,n+1) represents mel-frequency filter bank spectrum information corresponding to $b^{th}$ mel-frequency filter of n+1$^{th}$ frame, M'(m,n) represents delta spectrum information corresponding to $m^{th}$ sample of $n^{th}$ frame, and B represents the number of the mel-frequency filter.

The delta spectrum entropy value is obtained through the following equation at the step (d-9), $$H'_{MFB}(n) = -\sum_{b=1}^{B} P[M'(b,n)]\log P[M'(b,n)]$$

in which H'$_{MFB}$(n) represents the delta spectrum entropy value corresponding to the $n^{th}$ frame, P[M'(b,n)] represents the normalized delta spectrum information according to $b^{th}$ mel-frequency filter of $n^{th}$ frame, and B represents the number of the mel-frequency filter.

The step (e) includes (e-1) comparing the computed delta spectrum entropy value with the predetermined critical value and (e-2) judging the input signal present in the first frame as an audio signal when the computed delta spectrum entropy value exceeds the critical value after the comparison.

The first frame and the second frame are subsequently selected according to the time sequence among the divided frame, and the steps from (b) to (e) are repeatedly implemented for every first and second frame.

The step (d) includes (d-10) comparing the delta spectrum entropy value with the predetermined standard value, and the step (e) is implemented only when the delta spectrum entropy value exceeds the standard value after the comparing.

According to another aspect of the present invention, there is provided a signal detecting apparatus. The apparatus for signal detection comprises a dividing portion for dividing a received input signal into a frame unit, a transforming portion for transforming the input signal present in the first frame and the second frame into a frequency signal, a computing portion for computing first power spectrum information and second power spectrum information utilizing the transformed frequency signal, an obtaining portion for obtaining a delta spectrum entropy value corresponding to a difference of the computed power spectrum information and a judging portion for judging if a predetermined input signal is included in a predetermined frame among the input signal through comparing the delta spectrum entropy value with a critical value.

The obtaining portion computes delta spectrum information, which is the difference between the first power spectrum information and the second power spectrum information, normalizes the computed delta spectrum information and obtains the delta spectrum entropy value from the normalized delta spectrum information.

The judging portion compares the computed delta spectrum entropy value with the predetermined critical value and judges the input signal corresponding to the first frame as a detect signal when the computed delta spectrum entropy value exceeds the critical value.

The obtaining portion includes a mel-frequency filter bank (MFB) portion for generating first mel-frequency filter bank spectrum information and second mel-frequency filter bank spectrum information from the first power spectrum information and the second power spectrum information and a delta spectrum entropy portion for obtaining a delta spectrum entropy value from the generated first mel-frequency filter bank spectrum information and the second mel-frequency filter bank spectrum information, and the input signal is an audio input signal.

The delta spectrum entropy portion computes delta spectrum information utilizing the first mel-frequency filter bank spectrum information and the second mel-frequency filter bank information, normalizes the computed delta spectrum information, and obtains the delta spectrum entropy value from the normalized delta spectrum information.

The judging portion compares the computed delta spectrum entropy value and the predetermined critical value, and judges the input signal present in the first frame as an audio signal when the computed delta spectrum entropy value exceeds the critical value.

According to further another aspect of the present invention, there is provided a recording medium on which a program for executing the signal detecting method is recorded. The recording medium including a program for executing a method of signal detection according to a preferred embodiment of the present invention, is a recording medium comprising a typically accomplished program of instructions executable by a digital processing apparatus for implementing a method of a method of signal detection comprising (a) dividing a received input signal into a frame unit (b) transforming each input signal present in a first frame and a second frame into a frequency signal (c) computing first power spectrum information and second power spectrum information utilizing the transformed frequency signal (d) obtaining a delta spectrum entropy value corresponding to a difference of the computed power spectrum information and (e) judging if a predetermined input signal is included in a predetermined frame among the input signal through comparing the delta spectrum entropy value with a critical value.

According to the embodiment of the present invention, signal detection is possible through processing a small amount of operation by utilizing a delta spectrum entropy value.

In addition, the audio signal can be applied in an embedded environment, and noise including white noise can be efficiently eliminated according to the present invention.

BRIEF DESCRIPTION OF DRAWINGS

FIG. 4 is a diagram for explaining a mel-frequency filter bank according to an embodiment of the present invention.

DETAILED DESCRIPTION OF THE INVENTION

Figure 1:
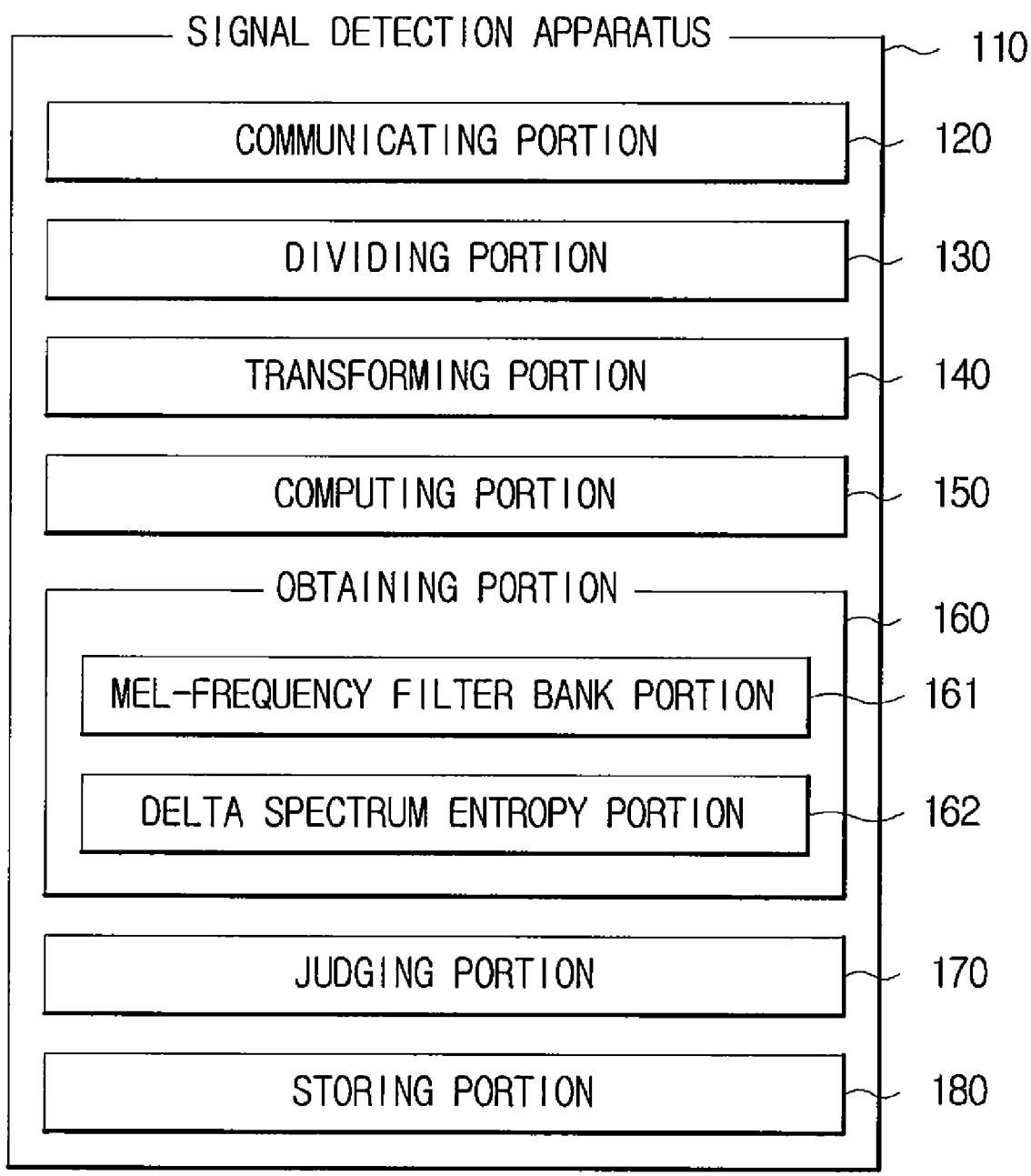
FIG. 1 is a block diagram for explaining the constitution of a signal detecting apparatus according to an embodiment of the present invention.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, number, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some embodiments will be described in detail with reference to the accompanying drawings. Identical or corresponding elements will be given the same reference numerals, regardless of the figure number, and any redundant description of the identical or corresponding elements will not be repeated. Throughout the description of the present invention, when describing a certain technology is determined to evade the point of the present invention, the pertinent detailed description will be omitted.

Referring to FIG. 1, the constitution of the signal detecting apparatus according to the embodiment of the present invention will be described.

FIG. 1 is a block diagram for explaining the constitution of a signal detecting apparatus 100 according to an embodiment of the present invention.

The signal detecting apparatus 110 includes a communicating portion 120, a dividing portion 130, a transforming portion 140, a computing portion 150, an obtaining portion 160, a judging portion 170 and a storing portion 180.

The communicating portion 120 executes a communication such as data sending/receiving between the signal detecting apparatus and an external apparatus. In the present invention, the communicating portion 120 receives an input signal. In addition, the communicating portion 120 transmits a detected signal to other external apparatus, sends/receives data and executes sending/receiving a concerned control signal.

The dividing portion 130 divides the received input signal into a predetermined frame unit. More particularly, the dividing portion 130 divides the received input signal into a predetermined unit time through a window processing. Here, the dividing portion 130 can constitute the divided each input signal as a frame unit. The window processing will be described in detail hereinafter.

For example, when the input signal is an audio signal, the dividing portion 130 implements a filtering of the input signal by using a preemphasis filter, and then, the filtered input signal is divided into a predetermined frame unit through a hamming window process.

Here, the preemphasis filter emphasized a predetermined portion previously at the sending portion to improve S/N characteristic and distortion characteristic of transmission.

According to an embodiment of the present invention, the preemphasis filter can be used to emphasize the high frequency domain of the received audio input signal. For example, human audio signal has a loss of 6 dB per octave. The preemphasis filter compensates the lost 6 dB.

The hamming window process is a kind of window processing for dividing an input signal into a predetermined unit. In particular, the hamming window processing method includes multiplying each functional value of the input signal by predetermined hamming coefficient and then window processing. Here, the hamming window processing method compensates discontinuity generated by dividing an input signal into a predetermined frame. More particularly, the input signal is divided into a plurality of frames. At this time, both end values of the frame might be discontinuous with the end value of continuous frame. The hamming window executes the window processing so that both end values of each frame approach to 0 in order to reduce the generated discontinuity.

The transforming portion 140 transforms each input signal present in the divided frame after the window processing into the signal of the frequency domain. Here, the transforming portion 140 transforms the input signal of time domain into a signal of frequency domain utilizing a fast fourier transform (FFT).

At this time, the fast fourier transform is a method of transforming time domain signal into frequency domain signal and of which detailed algorithm is widely known to the one skilled in this field. Therefore, the description on the algorithm will be omitted for clear understanding and the convenience of explanation of the present invention.

The computing portion 150 computes power spectrum information with respect to each frame from the transformed frequency signal, that is, transformed signal from time domain input signal into frequency domain signal.

According to the preferred embodiment of the present invention, a plurality of signals of frequency component can be included in one frame. At this time, the computing portion 150 computes the power spectrum information through squaring the magnitude value (absolute value) corresponding to each frequency component.

The obtaining portion 160 obtains a delta spectrum entropy value from the computed power spectrum information. In particular, the obtaining portion 160 selects power spectrum information corresponding to two frames among the power spectrum information corresponding to each frame computed by the computing portion 150.

The obtaining portion 160 obtains a delta spectrum entropy value by utilizing the difference of the selected two power spectrum information, that is, the first power spectrum information and the second power spectrum information.

Here, the two selected power spectrum can be a frame for detecting signal (a first frame) and a previous frame of the first frame. For example, the obtaining portion 160 selects $n^{th}$ frame and then $n+1^{th}$ frame as the first frame and the second frame.

As described above, the obtaining portion 160 obtains delta spectrum entropy utilizing the difference of the power spectrums of the selected continuous two frames.

After that, the obtaining portion 160 normalizes the computed delta spectrum information and obtains the delta spectrum entropy value from the normalized delta spectrum information.

In addition, according to another embodiment of the present invention when the input signal is an audio input signal, the obtaining portion 160 includes a mel-frequency filter bank portion 161 and a delta spectrum entropy portion 162.

The mel-frequency filter bank portion 161 can produce mel-frequency filter bank spectrum information corresponding to each first and second power spectrum information computed at each frame (for example, the first and second frame) utilizing the mel-frequency filter bank including at least one mel-frequency filter.

At this time, the mel-frequency filter bank spectrum is the resultant information produced by applying the computed power spectrum information to at least one mel-frequency filter. The preferred embodiment on the mel-frequency filter bank will be described in detail when explaining FIG. 4.

The delta spectrum entropy portion 162 obtains the delta spectrum entropy value from the generated mel-frequency filter bank spectrum information.

The judging portion 170 compares the obtained delta spectrum entropy value with a predetermined critical value and judges if the input signal corresponding to the frame is a detect signal.

Here, the detect signal can be judged differently according to the kind of the input signal.

For example, when the input signal is supposed to an audio signal, the received input signal can be a mixed form of a real audio signal and noise signal. Here, if a signal not including specific information (a signal having only noise signal) is received, the delta spectrum entropy value might not significantly large, while if the real audio signal is received, the delta spectrum entropy value might be increased.

Therefore, when an audio signal is received, the judging portion 170 judges the signal present at the corresponding frame as not a noise signal but an audio signal when the delta spectrum entropy value exceeds a critical value.

Referring to another embodiment, when the input signal is supposed to be a network traffic signal, the judging portion 170 judges that the delta spectrum entropy value is low for a normal state (a state when traffic is not excessive) while is high for an abnormal state (a state when traffic is rapidly increased).

Accordingly, when the delta spectrum entropy value exceeds the critical value, the judging portion 170 judges the received signal from corresponding network as a signal of an excessive traffic state.

The storing portion 180 stores every information and input signal information for accomplishing the purpose of the signal detecting apparatus 110. In particular, predetermined critical value and/or window information (including hamming window information) can be included in the storing portion 180 in the present invention.

In this specification, each constituting portion such as the communicating portion, the dividing portion, etc. is explained as a separated portion, however, the present invention is not limited to this embodiment. All or a portion of the portions of the present invention can be embodied as a module for storing and executing one program for accomplishing the present invention.

The constitution of the signal detecting apparatus 110 and the function of each portion according to an embodiment of the present invention were explained referring to FIG. 1. Hereinafter, a method of detecting signal according to a first and second embodiment of the present invention will be described referring to FIG. 2 and FIG. 3.

Figure 2:
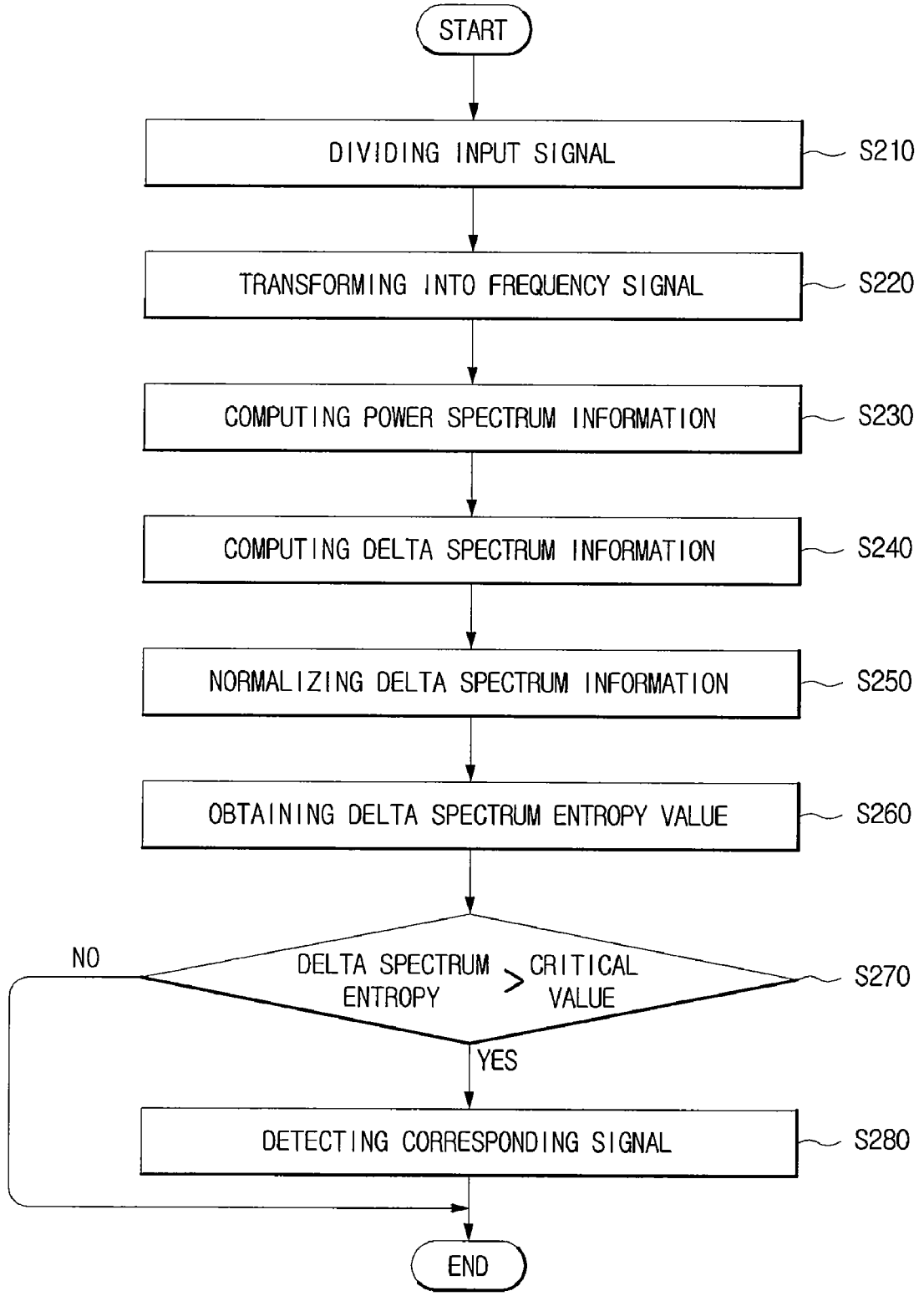
FIG. 2 is a flow chart for explaining the signal detecting method according to an embodiment of the present invention.

FIG. 2 is a flow chart for explaining a method of signal detection according to the first embodiment of the present invention.

The signal detecting apparatus 110 receives an input signal, eliminates noise from the received input signal, detects an audio signal or perceives a changing signal of the input signal state (a signal generating an excessive traffic) to detect a target signal.

At the step S210, the signal detecting apparatus 110 divides the received input signal into a predetermined frame unit.

At this time, the signal detecting apparatus 110 divides the input signal through a window processing. The window processing is for dividing the input signal into a predetermined size of frame unit. For example, an input signal is supposed to be defined by a function of time. According to the window process, the functional value of the input signal is multiplied by 1 when the time is in the range of from 1 to 4, while multiplied by 0 when the time is in the remaining range to produce one frame. Through applying the window process, that is, a multiplying process by 1 and 0, for various ranges, the input signal can be divided into a plurality of frames.

Then, the input signal present in the produced frame is transformed into a frequency signal by utilizing the signal detecting apparatus 110 at the step S220. At this time, the produced frame is at least one and the signal detecting apparatus 110 transforms the input signal in each frame into the frequency signal. Here, the signal detecting apparatus 110 executes the transformation by using fast fourier transform.

More particularly, the frequency signal obtained after executing the fast fourier transform is obtained by applying the following math equation 1.

$$X(i, n) = \sum_{m=1}^{N} x(m, n) e^{-i\frac{2n}{N}m}$$ [math equation 1]

Here, X(i,n) represents a frequency signal obtained by executing the fast fourier transform corresponding to the $i^{th}$ frequency component of the $n^{th}$ frame, x(m,n) represents an input signal corresponding to the $m^{th}$ sample of the $n^{th}$ frame. M represents the number of sample of one frame of a time domain, and N represents a period of the input signal. K is a constant and means that a number of angular velocity is required.

Next, the signal detecting apparatus 110 computes a power spectrum for each frame from the frequency signal obtained through the fast fourier transform at the step S230.

The signal detecting apparatus 110 computes first power spectrum information from the frequency signal obtained by transforming the input signal of the first frame and computes second power spectrum information from the frequency signal obtained by transforming the input signal of the second frame.

More particularly, the method of computing the power spectrum information will be described using the following math equation 2.

$$S(i,n) = |X(i,n)|^2$$ [math equation 2]

Here, S(i,n) represents power spectrum information corresponding to the $i^{th}$ frequency component of the nth frame, X(i,n) represents a frequency signal obtained by executing the first fourier transform corresponding to the $i^{th}$ frequency component of the nth frame, as described above.

Therefore, power spectrum information can be computed by squaring the absolute value of corresponding frequency signal according to the embodiment of the present invention.

The signal detecting apparatus 110 computes delta spectrum information using the computed first power spectrum information and the second spectrum information at step S240. Here, the delta spectrum information is information obtained by reflecting time change (time difference) information.

The delta spectrum information can be computed by the following math equation 3.

$$S(i,n) = S(i,n+1) - S(i,n)$$ [math equation 3]

Here, S(i,n) represents delta spectrum information corresponding to the $i^{th}$ frequency component of the $n^{th}$ frame, S(i,n) represents power spectrum information corresponding to the $i^{th}$ frequency component of the $n^{th}$ frame, and S(i,n+1) represents power spectrum information corresponding to the $i^{th}$ frequency component of the $n+1^{th}$ frame.

According to math equation 3, the delta spectrum information is computed by subtracting the second power spectrum information from the first power spectrum information. Here, the second power spectrum information can be the power spectrum information corresponding to the frame next to the first spectrum information.

Then, the computed delta spectrum information is normalized by the signal detecting apparatus 110 at step S250.

The signal detecting apparatus 110 normalizes the delta spectrum information according to the following math equation 4.

$$P[S'(i, n)] = \frac{|S'(i, n)|}{\sum_{m=1}^{M/2} |S'(m, n)|}$$ [math equation 4]

P[S'(i,n)] represents normalized delta spectrum information corresponding to the $i^{th}$ frequency component of the $n^{th}$ frame, S'(i,n) represents delta spectrum information corresponding to the $i^{th}$ frequency component of the $n^{th}$ frame, S'(m,n) represents delta spectrum information corresponding to the $m^{th}$ sample of the $n^{th}$ frame, and M represents the number of samples included in one frame.

After that, the signal detecting apparatus 110 obtains a delta spectrum entropy value from the normalized delta spectrum information at step S260.

As described above, time dependent information is used for detecting signal which can be processed in real time and is applicable to an embedded system in the present invention. Therefore, the signal is detected not by using the entropy value obtained from the power spectrum information but by the delta spectrum entropy value obtained from the delta spectrum information.

Here, the delta spectrum entropy value is obtainable through the following math equation 5.

$$H'(n) = -\sum_{i=1}^{M/2} P[S(i,n)] \log P[S'(i,n)] \quad \text{[math equation 5]}$$

H'(n) represents a delta spectrum entropy value of the $n^{th}$ frame, P[S'(i,n)] represents normalized delta spectrum information corresponding to the $i^{th}$ frequency component of the $n^{th}$ frame, and M represents the number of samples included in one frame, as described above.

Next, the signal detecting apparatus 110 compares the obtained delta spectrum entropy value with predetermined critical value at steps S270 and S280. When the obtained delta spectrum entropy value exceeds a predetermined critical value through the comparing, the signal detecting apparatus 110 detects an abnormal signal or an audio signal present in a frame corresponding to the exceeding delta spectrum entropy value.

For example, when an input signal is a network traffic signal and the delta spectrum entropy value exceeds the predetermined critical value, the signal detecting apparatus 110 judges the input signal present in the corresponding frame as a signal representing an excessive traffic and can detect a corresponding input signal.

When the delta spectrum entropy value is lower than the predetermined critical value, the signal detecting apparatus 110 judges the corresponding frame including much noise, and cannot detect the predetermined input signal.

In addition, the signal detecting apparatus 110 repeatedly implements the above-described steps from S220 to S280 for the input signal present in every divided frame. The signal detecting apparatus 110 repeats the above-described steps to detect every signal required from the received input signal.

For example, the signal detecting apparatus 110 divides an input signal into 100 frames. The signal detecting apparatus 110 transforms the input signal of every frame into frequency signals. Then, the signal detecting apparatus 110 implements steps S230 to S280 with respect to the first frame and the second frame. Therefore, the signal detecting apparatus 110 judges if the input signal present in the first frame is desired one or not.

The signal detecting apparatus 110 implements the steps S230 to S280 for the second frame and the third frame. Accordingly, the signal detecting apparatus 110 judges if the input signal present in the second frame is desired one or not.

As described above, the signal detecting apparatus 110 computes delta spectrum entropy 99 times for 100 frames. So, the signal detecting apparatus 110 judges if the received input signal is the desired input signal or not and detects the desired input signal of a user.

However, the signal detecting apparatus 110 might select a partial frequency coefficient or a partial mel-frequency filter band and implement steps S220 to S280 repeatedly only for the selected frequency coefficient or the mel-frequency filter band. The signal detecting apparatus 110 executes the above-described steps only for the partial frequency coefficient or a partial mel-frequency filter band to minimize the operating amount and improve the signal detecting efficiency. Accordingly, the signal detecting apparatus 110 of the present invention can detect signals in real time.

At this time, the signal detecting apparatus 110 can select an optional frame or a frame of which delta spectrum information is correspondent to a predetermined standard value.

The selection of a portion of the frame can be executed through various appropriate methods according to the received input signal.

Figure 3:
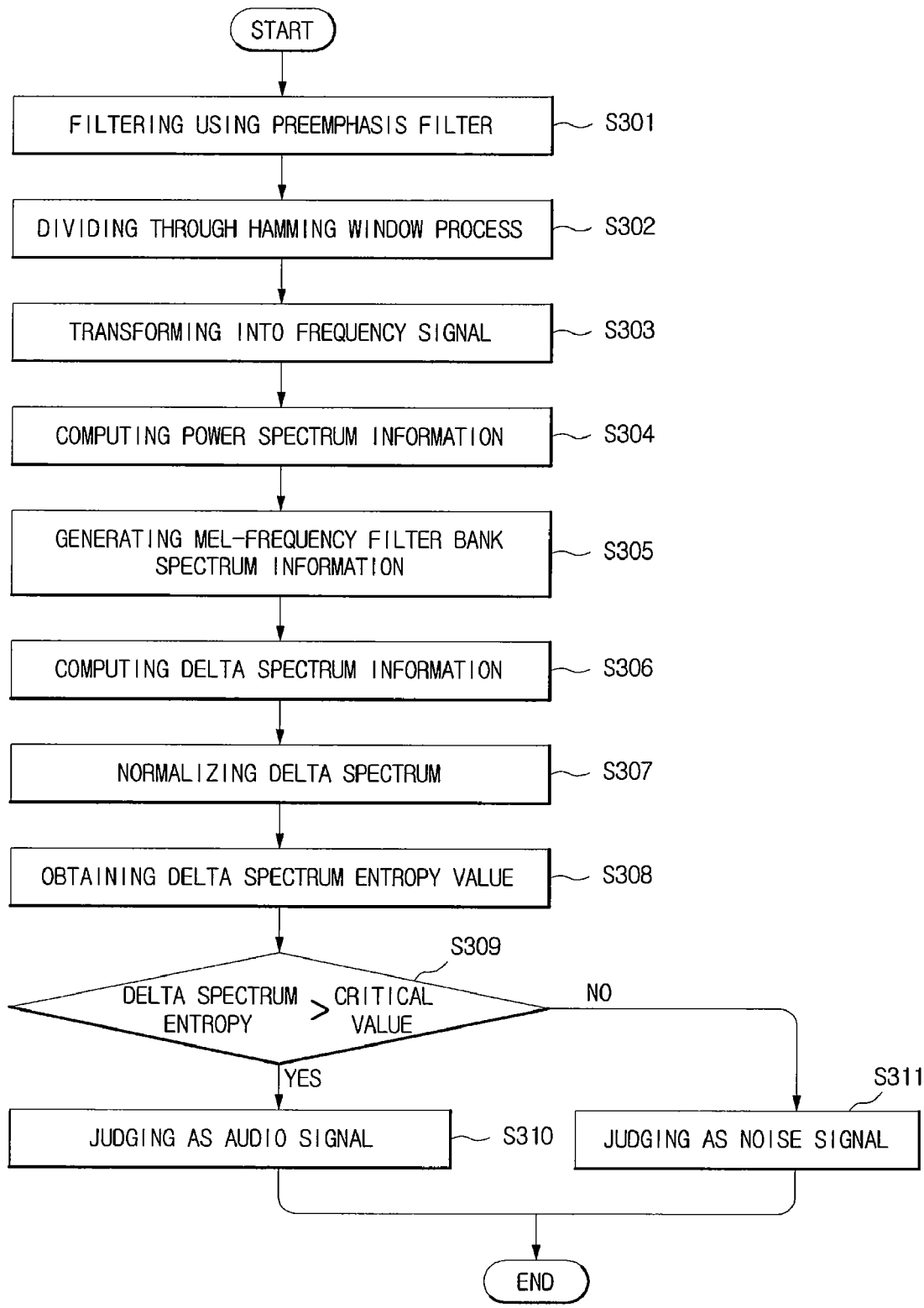
FIG. 3 is a flow chart for explaining the signal detecting method according to a second embodiment of the present invention.

FIG. 3 is a flow chart for explaining a method of signal detection according to a second embodiment of the present invention.

According to a second embodiment of the present invention, the input signal is an audio input signal, and the audio input signal might include an audio signal and a noise signal. The signal detecting apparatus 110 detects the audio signal from the received audio input signal to remove the noise.

At step S301, the signal detecting apparatus 110 implements filtering the received audio input signal utilizing a preemphasis filter. Here, the preemphasis filter is a filter emphasizing a high frequency domain. Human audio signal loses 6 dB per octave when speaking. The signal detecting apparatus 110 might utilize the preemphasis filter to compensate the lost 6 dB.

Then, the signal detecting apparatus 110 divides the filtered input signal into a predetermined frame unit through a hamming window process at step S302.

The hamming window process is one of the above-described window process and is implemented by multiplying a hamming coefficient before executing the window process.

Through the hamming window process, the filtered input signal by the preemphasis is multiplied by the hamming coefficient, to relieve discontinuity between frames due to the window processing.

Then, the signal detecting apparatus 110 transforms the audio input signal present in corresponding frame into frequency signal (see step S220 in FIG. 2), and then computes the power spectrum information of the transformed frequency signal at the steps S303 and S304.

The process to the step of computing the power spectrum information (step S304) is similar to that from S220 to S230 described referring to FIG. 2, and therefore, detailed description concerning this process will be omitted for the clear understanding and the convenience of the present invention.

Then, the signal detecting apparatus 110 generates mel-frequency filter bank (MFB) spectrum information utilizing the computed power spectrum information at step S305.

Here, the mel-frequency filter bank transforms the power spectrum information into mel-scale, and mel-frequency filter bank spectrum information can be the transformed power spectrum information into mel-scale.

The signal detecting apparatus 110 generates first mel-frequency filter bank spectrum information from the computed first power spectrum information and can produce second mel-frequency filter bank spectrum information from the computed second power spectrum information.

At this time, the mel-frequency filter bank is utilized in a characteristic extracting method of voice recognition. The frequency characteristic perceived subjectively by human is applicable to the mel-scale. Here, human voice perceiving characteristic generally exhibits a sensitive reaction to a low frequency while a dull reaction to a high frequency.

A voice recognition method using the mel-frequency filter bank, which distributes the filter bank non-linearly by transforming the frequency into the mel-scale and reflects the above described characteristic, is widely used.

The operation of the mel-frequency filter bank will be described in detail in FIG. 4.

The spectrum information of mel-frequency filter bank can be generated using the following math equation 6.

$$M(b, n) = \frac{\sum_{i=L_b}^{U_b} V_b(i) S(i, n)}{\sum_{i=L_b}^{U_b} V_b(i)} \quad \text{[math equation 6]}$$

Here, $M(b,n)$ represents delta mel-frequency filter bank spectrum information corresponding to the $b^{th}$ mel-frequency filter of the $n^{th}$ frame, $V_b(i)$ represents a weight applicable to the $i^{th}$ frequency component of the $b^{th}$ mel-frequency filter. In addition, $S(i,n)$ is power spectrum information corresponding to the $i^{th}$ frequency component of the $n^{th}$ frame, $L_b$ is a start-frequency of the $b^{th}$ mel-frequency filter and $u_b$ is an end-frequency of the $b^{th}$ mel-frequency filter.

Then, the signal detecting apparatus 110 computes delta spectrum information using the mel-frequency filter bank spectrum information at step S306.

According to the present invention, signal detection is implemented by using delta spectrum information including time changeable information. Accordingly, the signal can be detected using a small amount of operation in the present invention as described above.

Here, the delta spectrum information is computed through the following math equation 7.

$$M'(b,n) = M(b,n+1) - M(b,n) \quad \text{[math equation 7]}$$

Here, $M'(b,n)$ represents delta spectrum information corresponding to the $n^{th}$ frequency component of the $b^{th}$ mel-frequency filter, $M(b,n)$ represents mel-frequency filter bank spectrum information according to the $b^{th}$ mel-frequency filter of the $n^{th}$ frame, $M(b,n+1)$ represents mel-frequency filter bank spectrum information corresponding to the $b^{th}$ mel-frequency filter of the $n+1^{th}$ frame.

According to the above-described math equation, the delta spectrum information can be computed by a difference between the first mel-frequency filter bank spectrum information and the second mel-frequency filter bank spectrum information in the second embodiment of the present invention.

After that, the signal detecting apparatus 110 normalizes the delta spectrum information and obtains the delta spectrum entropy value from the normalized delta spectrum information at steps S307 and S308.

Here, the normalization of the delta spectrum and the obtaining of the delta spectrum entropy value can be executed by using the following math equations 8 and 9.

$$P[M'(b, n)] = \frac{|M'(b, n+1)|}{\sum_{m=1}^{B} |M'(m, n)|} \quad \text{[math equation 8]}$$

$$H'_{MFB}(n) = -\sum_{b=1}^{B} P[M'(b, n)] \log P[M'(b, n)] \quad \text{[math equation 9]}$$

In the math equations 8 & 9, $P[M'(b,n)]$ represents normalized delta spectrum information according to the $b^{th}$ mel-frequency filter of the nth frame. $M'(b,n+1)$ represents mel-frequency filter bank spectrum information corresponding to the $b^{th}$ mel-frequency filter of the $n+1^{th}$ frame, $M'(m,n)$ represents delta spectrum information corresponding to the $m^{th}$ sample of the $n^{th}$ frame. B represents a coefficient of the mel-frequency filter. $H'_{MFB}(n)$ represents the delta spectrum entropy value corresponding to the $n^{th}$ frame.

The signal detecting apparatus 110 obtains a delta spectrum entropy value including time changeable information through the above-described math equation.

Then, the signal detecting apparatus 110 compares the obtained delta spectrum entropy value with the predetermined critical value at step S309. At step S310, when the obtained delta spectrum entropy value exceeds the predetermined critical value, the signal detecting apparatus 110 judges the input signal present in the frame corresponding to the delta spectrum entropy value as an audio signal. At this time, when a user wants to detect an audio signal, the user can detect corresponding input signal.

At step S311, when the obtained delta spectrum entropy value is less than the predetermined critical value, the signal detecting apparatus 110 judges the input signal present in the frame corresponding to the delta spectrum entropy value as a noise signal.

In addition, the signal detecting apparatus 110 can repeatedly execute the above described steps from S303 to S311 for each input signal present in every divided frame as described above. The signal detecting apparatus 110 implements repeatedly the above described steps for every frame to detect every audio signal from the received input signal.

As described above, when the input signal is divided into 100 frames, the signal detecting apparatus 110 can select continuous two frames as a first frame and a second frame.

After that, the signal detecting apparatus 110 can repeat the above described steps from S304 to S308 with respect to the frames constituted of 99 pairs.

Accordingly, the signal detecting apparatus 110 computes 99 delta spectrum entropy values. The signal detecting apparatus 110 compares the computed 99 delta spectrum entropy value with each critical value. The signal detecting apparatus 110 detects desired input signal (for example, audio signal) among the received input signal according to the comparison result.

However, the signal detecting apparatus 110 can select a portion of the frames and repeatedly implement the steps from S303 to S311 only for the selected frames. The signal detecting apparatus 110 executes the above descried steps only for the portion of the frames to minimize the operating amount and to improve the audio signal detecting efficiency. Accordingly, the signal detecting apparatus 110 of the present invention can detect the audio signal in real time.

At this case, the signal detecting apparatus 110 can select an optional frame or can select a corresponding frame of which delta spectrum information reaches to a predetermined standard value.

The manner of selecting the portion of the frame can be diversely chosen according to the received input signal.

The method of detecting signal according to an embodiment of the present invention has been described referring to FIGS. 2 & 3. Hereinafter, the mel-frequency filter bank according to the preferred embodiment of the present invention will be described referring to FIG. 4.

FIG. 4 is a diagram for explaining a mel-frequency filter bank according to a preferred embodiment of the present invention.

The mel-frequency filter bank is utilized for the characteristic extraction of voice perception. The auditory sense of human does not react linearly to the frequency, but reacts sensitively to a specific frequency while is dull to a specific frequency.

As described above, the mel-scale is an appropriate frequency scale to the human auditory sense, which is felt non-linearly by human.

The following math equation 10 is a functional equation for transforming a linear frequency which is a real frequency into a mel-scale frequency signal.

$$mel(f) = 2595 \log_{16}\left(1 + \frac{f}{700}\right)$$ [math equation 10]

Here, mel(f) represents a frequency signal represented by a mel-scale and f is a linear frequency signal.

Through the math equation 10, the real linear frequency can be transformed into the mel-scale frequency signal, which is appropriate to the human auditory sense.

Referring to FIG. 4, a table 410 including a start-point and an end-point of a mel-frequency filter bank and a center frequency is illustrated.

For example, the center frequency is 65.9219, the start-point is 0 and the end-point is 125 for the filter named by fc[1]. In addition, the center frequency if 397.818, the start-point is 281.25 and the end-point is 500 for the filter named by fc[5].

As described above, the mel-frequency filter bank is a non-linear frequency scale and is an appropriate frequency scale for the human auditory sense.

When the received input signal is an audio input signal, the audio signal can be detected correctly and efficiently by using the mel-frequency filter bank according to the second embodiment of the present invention.

The present invention can be accomplished by a computer readable code on a computer readable recording medium. Computer readable recording medium includes a ROM, a RAM, a CD-ROM, a magnetic tape, a floppy disc, an optical data storage apparatus, and so on.

The present invention also can be accomplished by a carrier wave shape, for example, a transmission through an internet.

In addition, the computer readable recording medium can be distributed to the computer system connected through a network. Then, a computer readable code can be stored and executed by a distribution manner.

Further, the present invention also includes a functional program, a code and a code segment, etc. which can be easily deduced by programmers in this technical field for accomplishing the present invention.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of signal detection, comprising the steps of:
   (a) dividing a received input signal into a frame unit using a computer;
   (b) transforming an input signal present in a first frame into a first frequency signal and an input signal present in a second frame into a second frequency signal using a computer;
   (c) computing first power spectrum information and second power spectrum information utilizing the transformed first and second frequency signals, respectively using a computer;
   (d) obtaining a delta spectrum entropy value corresponding to a difference of the computed first and second power spectrum information using a computer; and
   (e) judging if a predetermined input signal is included in a predetermined frame among at least one of the first and second input signals through comparing the delta spectrum entropy value with a critical value using a computer;
   wherein the first frame and the second frame are selected according to a time sequence among the divided frame, and steps (b) to (e) are repeatedly implemented for every selected first frame and second frame;
   wherein the step (d) includes:
   (d-1) computing delta spectrum information which is a difference between the first power spectrum information and the second power spectrum information;
   (d-2) normalizing the computed delta spectrum information; and
   (d-3) obtaining the delta spectrum entropy value from the normalized delta spectrum information; and
   wherein the computed delta spectrum information at the step (d-2) is normalized by the following equation, $$P[S'(i,n)] = \frac{|S'(i,n)|}{\sum_{m=1}^{M/2} |S'(m,n)|}$$

in which P[S'(i,n)] represents normalized delta spectrum information corresponding to $i^{th}$ frequency component of $n^{th}$ frame, S'(i,n) represents delta spectrum information corresponding to $i^{th}$ frequency component of $n^{th}$ frame, S'(m,n) represents delta spectrum information corresponding to $m^{th}$ sample of $n^{th}$ frame, and M represents the number of samples included in one frame.

2. The method of signal detection as claimed in claim 1, wherein the step (a) is implemented by a step of (a-1) dividing the input signal into the frame unit through a window process.

3. The method of signal detection as claimed in claim 1, wherein the transforming in the step (b) is implemented by using a Fast Fourier Transform.

4. The method of signal detection as claimed in claim 1, wherein the delta spectrum information is computed by using the following equation, $$S'(i,n) = S(i,n+1) - S(i,n)$$

in which S'(i,n) represents delta spectrum information corresponding to $i^{th}$ frequency component of $n^{th}$ frame, S(i,n) represents power spectrum information corresponding to $i^{th}$ frequency component of $n^{th}$ frame, and S(i,n+1) represents power spectrum information corresponding to $i^{th}$ frequency component of $n+1^{th}$ frame.

5. The method of signal detection as claimed in claim 1, wherein the delta spectrum entropy value is obtained by using the following equation, $$H'(n) = -\sum_{i=1}^{M/2} P[S'(i,n)] \log P[S(i,n)]$$

in which H'(n) represents a delta spectrum entropy value of $n^{th}$ frame, P[S'(i,n)] represents normalized delta spectrum information corresponding to $i^{th}$ frequency component of $n^{th}$ frame, and M represents the number of samples included in one frame.

6. The method of signal detection as claimed in claim 1, wherein the step (e) includes:
   (e-1) comparing the obtained delta spectrum entropy value and the critical value; and
   (e-2) judging the input signal corresponding to the first frame as a detect signal when the obtained delta spectrum entropy value exceeds the critical value.

7. The method of signal detection as claimed in claim 1, wherein the step (d) further comprises a step (d-4) comparing the delta spectrum entropy value with a predetermined standard value, and the step (e) is implemented only when the delta spectrum entropy value exceeds the standard value after the comparison at the step (d-4).

8. The method of signal detection as claimed in claim 1, wherein the step (d) includes:
   (d-5) generating first mel-frequency filter bank (MFB) spectrum information and second mel-frequency filter bank information from the first power spectrum information and the second power spectrum information; and
   (d-6) obtaining the delta spectrum entropy value from the generated first mel-frequency filter bank spectrum information and the second mel-frequency filter bank spectrum information, and wherein the input signal is an audio input signal.

9. The method of signal detection as claimed in claim 8, wherein the step (a) includes:
   (a-3) filtering the input signal using a preemphasis filter; and
   (a-4) dividing the filtered input signal into a certain frame unit through a hamming window process.

10. The method of signal detection as claimed in claim 8, wherein the mel-frequency filter bank spectrum information in the step (d-5) is generated through the following equation, $$M(b,n) = \frac{\sum_{i=L_b}^{U_b} V_b(i) S(i,n)}{\sum_{i=L_b}^{U_b} V_b(i)}$$

in which, M(b,n) represents delta mel-frequency filter bank spectrum information corresponding to $b^{th}$ mel-frequency filter of $n^{th}$ frame, $V_b$(i) represents a weight applicable to $i^{th}$ frequency component of $b^{th}$ mel-frequency filter, S(i,n) represents power spectrum information corresponding to $i^{th}$ frequency component of $n^{th}$ frame, $L_b$ represents a start-frequency of $b^{th}$ mel-frequency filter, and $U_b$ represents an end-frequency of $b^{th}$ mel-frequency filter.

11. The method of signal detection as claimed in claim 8, wherein the step (d-6) includes:
   (d-7) computing delta spectrum information utilizing the first mel-frequency filter bank spectrum information and the second mel-frequency filter bank information;
   (d-8) normalizing the computed delta spectrum information; and
   (d-9) obtaining the delta spectrum entropy value from the normalized delta spectrum information.

12. The method of signal detection as claimed in claim 11, wherein the delta spectrum information in the step (d-7) is computed from the following equation, $$M'(b,n) = M(b,n+1) - M(b,n)$$

in which, M'(b,n) represents delta spectrum information corresponding to $i^{th}$ frequency component of $b^{th}$ mel-frequency filter, M(b,n) represents mel-frequency filter bank spectrum information according to $b^{th}$ mel-frequency filter of $n^{th}$ frame, and M(b,n+1) represents mel-frequency filter bank spectrum information corresponding to $b^{th}$ mel-frequency filter of $n+1^{th}$ frame.

13. The method of signal detection as claimed in claim 11, wherein the computed delta spectrum information is normalized at the step (d-8) through the following $$P[M'(b,n)] = \frac{|M'(b,n+1)|}{\sum_{m=1}^{B} |M'(m,n)|}$$

in which,
P[M'(b,n)] represents normalized delta spectrum information according to $b^{th}$ mel-frequency filter of $n^{th}$ frame, M'(b,n+1) represents mel-frequency filter bank spectrum information corresponding to $b^{th}$ mel-frequency filter of $n+1^{th}$ frame, M'(m,n) represents delta spectrum information corresponding to $m^{th}$ sample of $n^{th}$ frame, and B represents the number of the mel-frequency filter.

14. The method of signal detection as claimed in claim 11, wherein the delta spectrum entropy value is obtained through the following equation at the step (d-9), $$H'_{MFB}(n) = -\sum_{b=1}^{B} P[M'(b,n)] \log P[M'(b,n)]$$

in which $H'_{MFB}$(n) represents the delta spectrum entropy value corresponding to the $n^{th}$ frame, P[M'(b,n)] represents the normalized delta spectrum information according to $b^{th}$ mel-frequency filter of $n^{th}$ frame, and B represents the number of the mel-frequency filter.

15. The method of signal detection as claimed in claim 8, wherein the step (e) includes:
   (e-1) comparing the computed delta spectrum entropy value with the predetermined critical value; and
   (e-2) judging the input signal present in the first frame as an audio signal when the computed delta spectrum entropy value exceeds the critical value after the comparison.

16. The method of signal detection as claimed in claim 8, wherein the first frame and the second frame are subsequently selected according to the time sequence among the divided frame, and the steps from (b) to (e) are repeatedly implemented for every first and second frame.

17. The method of signal detection as claimed in claim 16, wherein the step (d) includes:
   (d-10) comparing the delta spectrum entropy value with the predetermined standard value,
   and wherein the step (e) is implemented only when the delta spectrum entropy value exceeds the standard value after the comparing.

18. A digital processing apparatus having a computer processor for signal detection, the digital processing apparatus comprising:
   a dividing portion for dividing a received input signal into a frame unit;
   a transforming portion for transforming an input signal present in a first frame into a first frequency signal and an input signal present in a second frame into a second frequency signal;

a computing portion for computing first power spectrum information and second power spectrum information utilizing the transformed first and second frequency signals, respectively;

an obtaining portion for obtaining a delta spectrum entropy value corresponding to a difference of the computed first and second power spectrum information; and a judging portion for judging if a predetermined input signal is included in a predetermined frame among at least one of the first and second input signals through comparing the delta spectrum entropy value with a critical value;

wherein the apparatus is configured to select the first frame and the second frame according to a time sequence among the divided frame, and for transforming, computing, obtaining, and judging according to the respective portions of the apparatus for every selected first frame and second frame wherein the obtaining portion is further configured for:

computing delta spectrum information which is a difference between the first power spectrum information and the second power spectrum information;

normalizing the computed delta spectrum information; and obtaining the delta spectrum entropy value from the normalized delta spectrum information; and wherein the computed delta spectrum information at the step is normalized by the following equation, $$P[M'(b,n)] = \frac{|M'(b,n+1)|}{\sum_{m=1}^{B} |M'(m,n)|}$$

in which P[S'(i,n)] represents normalized delta spectrum information corresponding to $i^{th}$ frequency component of $n^{th}$ frame, S'(i,n) represents delta spectrum information corresponding to $i^{th}$ frequency component of $n^{th}$ frame, S'(m,n) represents delta spectrum information corresponding to $m^{th}$ sample of $n^{th}$ frame, and M represents the number of samples included in one frame.

19. The apparatus for signal detection as claimed in claim 18, wherein the judging portion compares the obtained delta spectrum entropy value with the critical value and judges the input signal corresponding to the first frame as a detect signal when the obtained delta spectrum entropy value exceeds the critical value.

20. The apparatus for signal detection as claimed in claim 18, wherein the obtaining portion includes:

a mel-frequency filter bank (MFB) portion for generating first mel-frequency filter bank spectrum information and second mel-frequency filter bank spectrum information from the first power spectrum information and the second power spectrum information; and a delta spectrum entropy portion for obtaining a delta spectrum entropy value from the generated first mel-frequency filter bank spectrum information and the second mel-frequency filter bank spectrum information, and wherein the input signal is an audio input signal.

21. The apparatus for signal detection as claimed in claim 20, wherein the delta spectrum entropy portion computes delta spectrum information utilizing the first mel-frequency filter bank spectrum information and the second mel-frequency filter bank information, normalizes the computed delta spectrum information, and obtains the delta spectrum entropy value from the normalized delta spectrum information.

22. The apparatus for signal detection as claimed in claim 20, wherein the judging portion compares the obtained delta spectrum entropy value and the critical value, and judges the input signal present in the first frame as an audio signal when the obtained delta spectrum entropy value exceeds the critical value.

23. A computer readable medium tangibly embodying a program of instructions in a non-transitory state and executable by a computer processing apparatus to execute a method of signal detection, the computer readable medium being readable by the computer processing apparatus, the program of instructions configured for:

(a) dividing a received input signal into a frame unit;

(b) transforming a first input signal present in a first frame into a first frequency signal and a second input signal present in a second frame into a second frequency signal;

(c) computing first power spectrum information and second power spectrum information utilizing the transformed first and second frequency signals, respectively;

(d) obtaining a delta spectrum entropy value corresponding to a difference of the computed first and second power spectrum information; and (e) judging if a predetermined input signal is included in a predetermined frame among at least one of the first and second input signals through comparing the delta spectrum entropy value with a critical value;

wherein the first frame and the second frame are selected according to a time sequence among the divided frame, and steps (b) to (e) are repeatedly implemented for every selected first frame and second frame wherein the step (d) includes:

(d-1) computing delta spectrum information which is a difference between the first power spectrum information and the second power spectrum information;

(d-2) normalizing the computed delta spectrum information; and (d-3) obtaining the delta spectrum entropy value from the normalized delta spectrum information; and wherein the computed delta spectrum information at the step (d-2) is normalized by the following equation, $$P[S'(i,n)] = \frac{|S'(i,n)|}{\sum_{m=1}^{M/2} |S'(m,n)|}$$

in which P[S∝(i,n)] represents normalized delta spectrum information corresponding to $i^{th}$ frequency component of $n^{th}$ frame, S'(I,n) represents delta spectrum information corresponding to $i^{th}$ frequency component of $n^{th}$ frame, S'(m,n) represents delta spectrum information corresponding to $m^{th}$ sample of $n^{th}$ frame, and M represents the number of samples included in one frame.

* * * * *